(12) United States Patent
Ravesi et al.

(10) Patent No.: US 9,331,151 B2
(45) Date of Patent: May 3, 2016

(54) METHOD FOR COUPLING A GRAPHENE LAYER AND A SUBSTRATE AND DEVICE COMPRISING THE GRAPHENE/SUBSTRATE STRUCTURE OBTAINED

(71) Applicant: STMicroelectronics S.r.l., Agrate Brianza (IT)

(72) Inventors: Sebastiano Ravesi, Catania (IT); Corrado Accardi, Ragusa (IT); Cristina Tringali, Augusta (IT); Noemi Graziana Sparta', Catania (IT); Stella Loverso, Catania (IT); Filippo Giannazzo, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 14/788,159

(22) Filed: Jun. 30, 2015

(65) Prior Publication Data
US 2015/0303264 A1     Oct. 22, 2015

Related U.S. Application Data

(63) Continuation of application No. 14/265,034, filed on Apr. 29, 2014, now Pat. No. 9,099,305.

(30) Foreign Application Priority Data

Apr. 30, 2013   (IT) .............................. TO2013A0348

(51) Int. Cl.
*H01L 23/58*     (2006.01)
*H01L 21/322*    (2006.01)
(Continued)

(52) U.S. Cl.
CPC ...... *H01L 29/1606* (2013.01); *H01L 21/02376* (2013.01); *H01L 21/7624* (2013.01); *H01L 29/78603* (2013.01); *H01L 29/78684* (2013.01); *H01L 31/028* (2013.01)

(58) Field of Classification Search
CPC ............... H01L 21/02376; H01L 21/02527; H01L 21/02381; H01L 21/02631; H01L 29/1606; B44C 1/17; B44C 1/24; B32B 37/02; B32B 37/12; B32B 37/26; H01M 4/625; H01M 4/1393; H01M 4/583; H01M 4/663; H01M 8/0234
USPC ......................................... 438/479, 584, 677
See application file for complete search history.

(56) References Cited

U.S. PATENT DOCUMENTS 9,099,305 B2 *   8/2015 Sparta' ............... H01L 21/7624
2011/0108521 A1  5/2011 Woo et al.
(Continued)

FOREIGN PATENT DOCUMENTS

EP       2 362 459        8/2011

OTHER PUBLICATIONS

American Chemical Society, "Transfer of graphene onto an arbitrary substrate surface by Nitto Denko thermal release tape," technical brochure, 2010.

(Continued)

*Primary Examiner* — Hsien Ming Lee
(74) *Attorney, Agent, or Firm* — Seed IP Law Group PLLC

(57) ABSTRACT

The present disclosure regards a method for coupling a graphene layer to a substrate having at least one hydrophilic surface, the method comprising the steps of providing the substrate having at least one hydrophilic surface, depositing on the hydrophilic surface a layer of a solvent selected in the group constituted by acetone, ethyl lactate, isopropyl alcohol, methylethyl ketone and mixtures thereof and depositing on the solvent layer a graphene layer. It moreover regards an electronic device comprising the graphene/substrate structure obtained.

32 Claims, 6 Drawing Sheets

(51) Int. Cl.
*H01L 29/16* (2006.01)
*H01L 21/02* (2006.01)
*H01L 21/762* (2006.01)
*H01L 29/786* (2006.01)
*H01L 31/028* (2006.01)

(56) References Cited

U.S. PATENT DOCUMENTS

| | | | |
|---|---|---|---|
| 2011/0300338 A1 | 12/2011 | Shin et al. | |
| 2012/0058350 A1 | 3/2012 | Long et al. | |
| 2012/0065298 A1* | 3/2012 | Setoguchi | C09D 5/028 523/457 |
| 2012/0329260 A1 | 12/2012 | Avouris et al. | |
| 2013/0065022 A1 | 3/2013 | Seo et al. | |
| 2013/0207091 A1 | 8/2013 | Wierzchowiec et al. | |

OTHER PUBLICATIONS

Caldwell et al., "Technique for the Dry Transfer of Epitaxial Graphene Onto Arbitrary Substrates," U.S. Naval Research Laboratory and the University of Maryland Electrical Engineering Department, 2009, 8 pages.
Crocellà, "Studio dell'Adsorbimento di Acetone su Sistemi Ossidici," Tesi di Laurea, Corso di Laurea Magistrate in Chimica Industriale, Università degli Studi di Torino, 2006/2007, 120 pages.
Emtsev et al., "Towards wafer-size graphene layers by atmospheric pressure graphitization of silicon carbide," *Nature Materials* 8:203-207, Mar. 2009.
Franceschin, "Funzionalizzazione Carbossilica su Substrati di Nitruro di Silicio," Corso di Laurea Triennale in Ingegneria dei Materiali, Università degli Studi di Padova, 2010/2011, 58 pages.
Giannazzo et al., "Mapping the Density of Scattering Centers Limiting the Electron Mean Free Path in Graphene," *Nano Letters* 11:4612-4618, 2011.
Kern, "RCA Critical Cleaning Process," Jun. 8, 2007, pp. 1-7, MicroTech Systems, Inc.
Kim et al., "Substrate-Induced Solvent Intercalation for Stable Graphene Doping", ACS NANO 20130226 American Chemical Society USA, vol. 7, No. 2, pp. 1155-1162, Feb. 26, 2013.
Lafkioti et al., "Graphene on a Hydrophobic Substrate: Doping Reduction and Hysteresis Suppression under Ambient Conditions", NANO Letters Apr. 14, 2014, American Chemical Society USA, vol. 10, No. 4, pp. 1149-1153, Apr. 14, 2010.
Li et al., "Graphene Films with Large Domain Size by a Two-Step Chemical Vapor Deposition Process," *Nano Letters*, 2010, 7 pages.
Liang et al., "Graphene Transistors Fabricated via Transfer-Printing in Device Active-Areas on Large Wafer," *Nano Letters* 7(12):3840-3844, 2007.
Novoselov et al., "Electric Field Effect in Atomically Thin Carbon Films," *Science* 306:666-669, Oct. 22, 2004.
Park et al., "Chemical methods for the production of graphenes," *Nature Nanotechnoogy*, Mar. 29, 2009, 8 pages.
Pasquariello, "Plasma Assisted Low Temperature Semiconductor Wafer Bonding," Comprehensive Summaries of Uppsala Dissertations from the Faculty of Science and Technology, Acta Universitatis Upsaliensis, 2001, 44 pages.
Pezoldt et al., "Graphene field effect transistor improvement by graphene-silicon dioxide interface modification," *Physica E*, 2011, 4 pages.
Rangel et al., "Mechanism of carbon nanotubes into graphene ribbons," *The Journal of Chemical Physics* 131:031105-1-031105-4, 2009.
Romero et al., "n-Type Behavior of Graphene Supported on $Si/SiO_2$ Substrates," *ACS Nano* 2(10):2037-2044, 2008.
Ryu et al., "Atmospheric Oxygen Binding and Hole Doping in Deformed Graphene on a $SiO_2$ Substrate," *Nano Letters* 10(12), Dec. 2010, 17 pages.
Schroder, *Semiconductor Material and Device Characterization*, Third Edition, John Wiley & Sons, Inc., 2006, "1: Resistivity," 14 pages.
Shin et al., "Surface energy engineering of graphene," National University of Singapore, 18 pages, 2010.
Si et al., "Synthesis of Water Soluble Graphene," *Nano Letters* 8(6):1679-1682, 2008.
Stolyarova et al., "Observation of Graphene Bubbles and Effective Mass Transport under Graphene Films," *Nano Letters* 9(1):332-337, 2009.
Yu et al., "Graphene segregated on Ni surface and transferred to insulators," *Applied Physics Letters* 93:113103-1-113103-4, 2008.
Zheng et al., "Wafer-scale graphene/ferroelectric hybrid devices for low-voltage electronics," *EPL* 93:17002-p. 1-17002-p. 4, 2011.

* cited by examiner

L=100 μm
W=200 μm
d=20, 20, 40, 60, 80, 100, 100 μm

METHOD FOR COUPLING A GRAPHENE LAYER AND A SUBSTRATE AND DEVICE COMPRISING THE GRAPHENE/SUBSTRATE STRUCTURE OBTAINED

BACKGROUND

1. Technical Field

The present disclosure relates to a method for coupling a graphene layer and a substrate, and a device comprising said graphene/substrate structure.

2. Description of the Related Art

In the last few years, application of surface-treatment techniques has made it possible to improve the properties of materials, involving an extremely wide range of industrial sectors, from the mechanical sector to the biomedical sector. The development of such treatments is the result of a considerable progress in research, pushed by the desire to increase the performance and potentialities of the surfaces treated and by the desire to reduce costs.

Application of such treatments, associated to the study of the interfaces of the materials involved, is fundamental in the development of systems that present a high surface/volume ratio since the phenomena that occur at the interface affect the physics of the system under examination, all the more, the greater said ratio.

Among the materials that have proven of particular interest, graphene, a material constituted by a single layer of carbon atoms arranged in a hexagonal crystalline lattice, presents surprising electrical, optical, and mechanical properties due to its two-dimensional structure.

Graphene can be obtained via processes of mechanical exfoliation, graphitization of silicon carbide (SiC), growth on metal substrates by means of chemical vapor deposition (CVD), exfoliation in liquid phase, and opening of carbon nanotubes.

Where the technique of production of graphene is based upon processes of CVD growth on metal substrates, or exfoliation techniques, in addition to the problem of choosing an adequate technique of transfer of the graphene onto a substrate, there is posed also the problem of identifying surface treatments capable of promoting adhesion of the graphene on the desired substrate, and at the same time, modulating appropriately the phenomena that occur at the graphene/insulator interface so that the electrical properties of the graphene will not be impaired by the treatment adopted.

Typically, a surface treatment is based upon techniques that aim at modifying the composition of a surface, incorporating elements or functional groups that modify the properties of the surface, but not those of the material as a whole.

In many cases, the surface treatment has the specific purpose of promoting adhesion between surfaces that are dissimilar so as to guarantee the temporary or permanent bonding between them.

For the adhesion between two surfaces to be effective, the surfaces must be clean, smooth, and chemically receptive. This is obtained through the aid of a wide range of techniques that may be of a mechanical, chemical, or physical type.

The mechanical methods, generally based upon abrasion of the surface, are very rough and invasive. These approaches, albeit modifying in a macroscopic way the surface (operating on the roughness, thickness, or planarity) frequently generate debris that abundantly contaminates the surface itself.

The procedures that presuppose the aid of chemical solutions use techniques of dipping, spin-coating, or casting of the surface to be treated in/with an appropriate solution.

Techniques of "self-assembly" of molecules by adopting the L-B (Langmuir-Blodget) procedure also form part of this strategy.

One of the physical treatments that are most widely used in the industrial field for deposition of functional coatings is that of vacuum plasma treatments.

The so-called "plasma" technology envisages the use of a partially ionized gas (plasma), made up of a mixture of electrons, positively and negatively charged particles, neutral atoms, and molecules. Each of said components can trigger chemical and physical reactions on the surface of the materials with which it comes into contact, and, in given conditions, can generate transient or permanent modifications.

This technique proves more versatile due to the possibility of modulating the surface properties (hydrophilia/hydrophobia, density of the functional groups, and stability of the film) by changing the process parameters (for example, power and modulation of the discharge, monomer/process gas ratio).

The selection of the appropriate procedure is made on the basis of the nature of the substrates involved and the type of interface that is to be obtained.

Since, in the case of graphene, it is a monolayer of carbon atoms, its electronic properties are strictly correlated to the nature of the substrate, to the gases, or more in general to the molecular environment that surrounds it.

Silicon oxide ($SiO_2$), the substrate that is commonly chosen for transfer and integration of the graphene, provides an excellent optical contrast, which, however, albeit enabling visual identification of the presence of the graphene, presents disadvantages linked to the surface roughness, to the high surface-charge concentration, to the presence of phonons, to the hydrophilic properties of the material, and to the low dielectric constant ($\kappa SiO_2 = 3.9$), which jeopardize the electrical performance thereof.

Effects of scattering due to the surface charge of the silicon oxide are in part responsible for the reduction of mobility of the carriers of the transferred graphene as compared to the carriers of the suspended graphene ($2.10^5$ $cm^2/V \cdot s$).

Experiments have moreover revealed the key role of the morphological structure of the silicon oxide: STM (Scanning Tunneling Microscopy) measurements suggest in fact that the graphene follows the roughness of the silicon oxide. Moreover, experiments on electro-mechanical systems made of graphene indicate that the substrate induces significant stresses in the graphene itself.

Another phenomenon that affects the electrical properties of the graphene transferred onto silicon oxide is the capacity of this for trapping chemical species. The surface of the oxide terminates, in fact, with hydroxyl polar groups, OH—, so that it attracts polar molecules like water. The surface of the oxide hence has one or more layers of water absorbed on the interface that is formed between the silicon oxide and the graphene.

The graphene/silicon oxide interface is undoubtedly complex not only on account of the chemico-physical properties of silicon oxide, but also on account of the hydrophobic behavior of the graphene itself (the angle of contact measured on the graphene obtained by mechanical cleavage is 91°). The poor adhesion of graphene on silicon oxide thus imposes a pre-treatment of the oxide for promoting adhesion and at the same time minimizing the chemico-physical interactions that jeopardize the electrical properties of the graphene.

In the past, different strategies have been proposed for favoring adhesion of the graphene to silicon-oxide surfaces, the most common of which (applied also on $Al_2O_3$ and GaN), has the purpose of cleaning the surface through a wet treatment followed by an oxygen plasma. The procedure envisages ultrasound cleaning (referred to as "SC-1 treatment"), followed by oxygen-plasma treatment.

The SC-1 treatment consists of cleaning with a mixture of water ($H_2O$), hydrogen peroxide ($H_2O_2$), and ammonium peroxide ($NH_4OH$).

The mixture is typically constituted by 5:1:1 parts per volume of $H_2O$, $H_2O_2$, and $NH_4OH$. The treatment envisages dipping of the substrate for 5 to 10 minutes in the solution heated to 70° C.-75° C., followed by rinsing in deionized water. The SC-1 treatment eliminates from the surface of the oxide organic contaminants through the solvatating effect of ammonium peroxide and the oxidizing action of hydrogen peroxide. The ammonium peroxide also has the task of removing metal elements, such as Cu, Au, Ag, Zn, and Cd, Ni, Co, Cr. The subsequent oxygen-plasma treatment has the purpose of cleaning the silicon-oxide surface and of modifying the chemical and electrostatic characteristics thereof. The effects that are noted on the treated surface are removal of the organic contaminants and the residual layers, increase of the surface tension, through reduction of the angle of contact in regard to liquids, and formation of a surface capable of reacting actively with the polymers.

Another approach presupposes the introduction of an additional treatment under hexamethyldisilazane (HMDS), which is carried out following upon the standard treatment that envisages SC-1 and oxygen plasma.

This procedure, by means of introduction of methyl groups, renders the silicon-oxide surface more hydrophobic, reducing the absorption of water at the interface formed by the graphene and the oxide.

In general, the most common wet treatment (SC-1) followed by oxygen plasma presents major limits of applicability. Typically, it is used on a non-structured substrate of $SiO_2$ and without metal contacts or interconnections, since the presence of solutions, such as $H_2O_2$ and the oxygen plasma itself, may dramatically jeopardize the pre-existing structure both from a morphological standpoint (roughness, wettability, phenomena of corrosion, chemical etching of the exposed surfaces, oxidation phenomena) and from an electrical standpoint (integrity of the metal surfaces, contact resistance).

In particular, the SC-1 treatment etches the following metals: Al, Cu, Ag, Ti. The following metals are not, instead, sensitive to this chemical treatment: Au, Pt, and Ni.

Consequently, in the devices obtained with the aid of graphene, whatever the application, there emerges a desire for architectures on $SiO_2$, which envisage integration of the graphene on the oxide as single and non-structured interface. To overcome the limits linked to poor adhesion of graphene on $SiO_2$, thus preventing introduction of pre-treatment of the surfaces, architectures are frequently favored that presuppose integration of suspended graphene between the source and drain contacts (for example, in production of a FET).

In this case, also the mobility of the carriers is indisputable favored, due to the absence of problematical interfaces, such as the $SiO_2$. However, this is an approach that cannot be applied over extensive areas (the size of the suspended graphene layer is tiny, just a few microns), it being markedly dependent upon the geometrical dimensions of the device.

Another approach is the one proposed in EP2362459, also published in U.S. Patent Publication No. 2012/058350, which makes it possible to overcome the limits linked to the interaction of the graphene with the surrounding environment (for example, absorption of oxygen and water) and at the same time promote its adhesion on substrates such as $SiO_2$. It is based upon a process of non-covalent functionalization of the silicon-oxide substrate on which the graphene with organic molecules is to be transferred. Said organic molecules are provided with groups that bind to the silicon oxide, such as for example diaminodecane.

In particular, formed on the silicon-oxide surface is a monolayer of molecules comprising an anchorage group, which creates a non-covalent bond with the graphene, a functional group, and an alkyl spacer group, which unites the functional group and the anchorage group and facilitates formation of the monolayer, promoting stability thereof.

Formation of this layer is basically due to the interactions of the amino groups with the surface of the substrate of $SiO_2$ via the Van der Waals forces. The monolayer may be formed by dipping the substrate in a solution containing the molecules to be immobilized or by depositing said solution, which is then left to act for a preset period of time.

A coating layer is thus created, having a dense and very stable structure, over the entire surface of the substrate.

In detail, the procedure of surface treatment illustrated in EP2362459 comprises the following steps:

dipping the substrate of oxidized silicon in a 10-mM solution of 1,10-diaminodecane for a duration of three hours;

rinsing in a mixture of solvents (1:10 methanol tetrahydrofuran), which has the purpose of removing the excess 1,10-diaminodecane; and drying in nitrogen gas.

This procedure presents the major limit of using dangerous chemical products, such as for example tetrahydrofuran, which reacts violently with oxidizing agents, generating explosions. It is moreover highly flammable, and may give rise to phenomena of uncontrolled polymerization.

The National Toxicology Program (NTP) of the U.S. Department of Health and Human Services has moreover highlighted that, in studies of inhalatory exposure of rats (two years), there has been observed a carcinogenic activity.

Another approach suggested by Liang et al. (Nanoletters, 2007) presupposes the introduction of low-viscosity thermal glues with a typical thickness of 10 nm.

After the process of thermal stabilization, the glue laid by casting or spin-coating on the surface of $SiO_2$ becomes solid and functions as dielectric in the graphene/silicon oxide interface.

This approach, which is rarely applied, presents the disadvantages typical of polymeric materials, namely, low temperature of vitreous transition, which hinders implementation of high-temperature processes, non-applicability on accentuated topography (>>10 nm), creation of a dielectric of lower quality than the insulators (gate oxide) most commonly used for producing an electronic device.

It is consequently felt in the art a desire to find a method alternative to those so far used for favoring coupling of a graphene monolayer and a substrate that is free from the disadvantages described above. In particular, there is felt the desire for a method that is simple and inexpensive, does not involve the use of toxic solvents, and may be used for deposition of graphene over extensive areas of a substrate, without altering the pre-existing structures either from the morphological standpoint or from the electrical standpoint.

BRIEF SUMMARY

One or more embodiments of the present disclosure is to provide a method that may provide low-cost products, entail a reduced number of steps, be fast in comparison with known methods, and enable deposition of graphene over extensive areas of a substrate, maintaining the electrical properties thereof.

One method comprises depositing a layer of a solvent on a hydrophilic surface of a substrate. The solvent may be selected from the group consisting of acetone, ethyl lactate, isopropyl alcohol, methylethyl ketone and mixtures thereof. The method further includes depositing a graphene layer on said solvent layer.

BRIEF DESCRIPTION OF THE SEVERAL VIEWS OF THE DRAWINGS

The present disclosure will now be described in detail with reference to the figures of the annexed plates of drawings, wherein.

DETAILED DESCRIPTION

Figure 1:
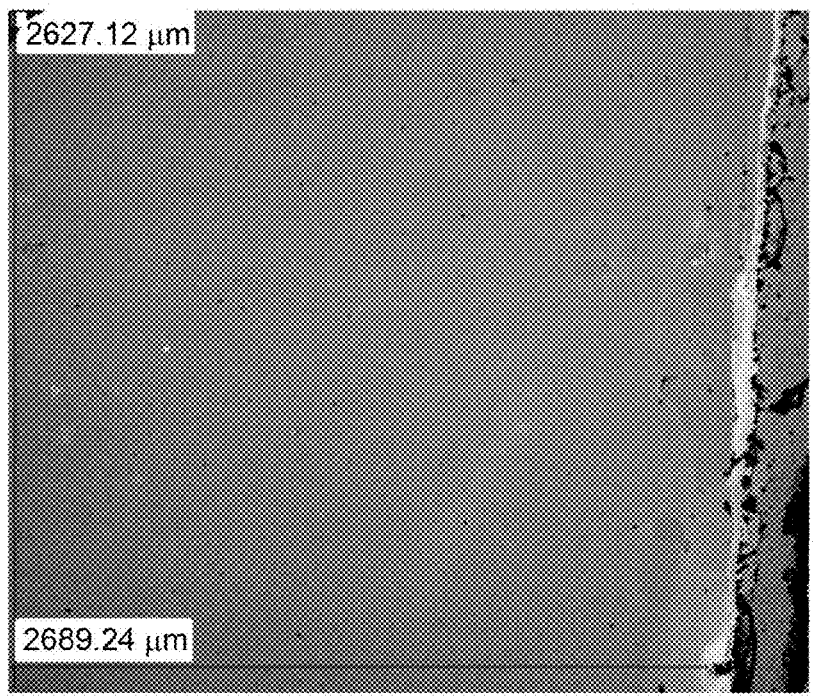
FIG. 1 illustrates a micrograph of a graphene-substrate structure obtained with the SC-1/oxygen plasma method according to the known art.

One or more embodiments of the present disclosure regards a method for coupling a graphene layer 4 to a substrate 2 having at least one hydrophilic surface 3, the method comprising the steps of:
 providing a substrate 2 having at least one hydrophilic surface 3;
 depositing on the hydrophilic surface 3 a layer of a solvent 5 selected in the group constituted by acetone, ethyl lactate, isopropyl alcohol, methylethyl ketone and mixtures thereof; and
 depositing on the solvent layer 5 a graphene layer 4.

According to one embodiment, the hydrophilic surface 3 is made of silicon oxide.

The substrate 2 is preferably made of silicon oxide or passivized silicon.

According to one embodiment the solvent may be a mixture of methylethyl ketone and ethyl lactate preferably present in a percentage of 40% and 60%, respectively.

Deposition of the solvent layer 5 may be obtained via dipping of the substrate in the solvent or via spin-coating.

In one embodiment, after deposition of the solvent layer 5 a step of washing with water followed by drying of the substrate may be carried out.

In one embodiment, the method is carried out at a temperature of between 20° C. and 45° C.

Advantageously, the methods according to the disclosure, via the aid of appropriate solvents or mixtures thereof, enables pre-treatment by dipping, casting, or spin-coating of a surface made, for example, of silicon oxide in order to modify appropriately the interface and promote adhesion of the graphene thereon.

The use of process parameters (temperatures) and solvents designed to modify temporarily the surface involved preserving the bulk characteristics thereof, and the extraordinary compatibility of the solvents used with the vast majority of the materials typically used for obtaining an electronic device moreover enables the procedure for use of planar $SiO_2$ substrates, as well as structured substrates containing, in addition to $SiO_2$, a multitude of elements such as metal layers made of Pt, Au, Cu, Ti, Ni, Al.

Present on the surface of non-treated silicon oxide (whether deposited or grown) are hydroxyl and silanolic groups, having a hydrophilic nature, on which water molecules can be adsorbed. During treatment of the surface of the oxide with the solvents, the alcohol and/or carbonyl groups of alcohol or ketone compounds, interact with the hydroxyl and silanolic groups present on the surface of the oxide by formation of bonds of an electrostatic nature.

The treatment of the silicon-oxide surface with the solvents previously indicated renders the surface of the oxide more hydrophobic, inhibiting formation of a layer at the interface between the oxide and the graphene constituted by water and silanolic groups. The water molecules hence do not manage to bind or re-organize on the surface of the oxide treated with the solvent.

The presence of a layer constituted by the alkyl groups of the solvent that face the surface consequently enables transfer of extensive areas of graphene by formation of Van der Waals electrostatic interactions. A thin hydrophobic liquid surface is consequently created on which the graphene adheres via weak electrostatic interactions.

The method according to many embodiments of the disclosure moreover proves semipermanent, hence enabling transfer of the graphene onto the pre-treated oxide even after some weeks, unlike the treatment with SC-1 and oxygen plasma, which is temporary. In this case, in fact, transfer of the graphene on the $SiO_2$ must be made in a sequential way with respect to pre-treatment of the surface.

However, the solvent layer deposited may be, if desired, removed with an oxygen plasma, thus restoring the silicon-oxide surface.

The method according to one or more embodiments of the disclosure presents the further advantage of modifying the angle of contact of the oxide, providing a more hydrophobic surface as compared to the standard treatment (SC-1+oxygen plasma).

The angle of contact of the treated oxide in fact reaches 40°, as against 0° (totally hydrophilic surface) reached with the standard treatment (SC-1+oxygen plasma). The hydrophobicity of the treated oxide, by hindering absorption of water molecules, plays a key role in improving the mobility of the carriers once transfer of the graphene has taken place.

One or more embodiments are scalable over a wide area or with a roll-to-roll process and enables pre-treatment of substrates of any shape and size. Moreover, the absence of an energetic mechanical action enables extension of the method to brittle, thin, or flexible substrates.

Figure 8:
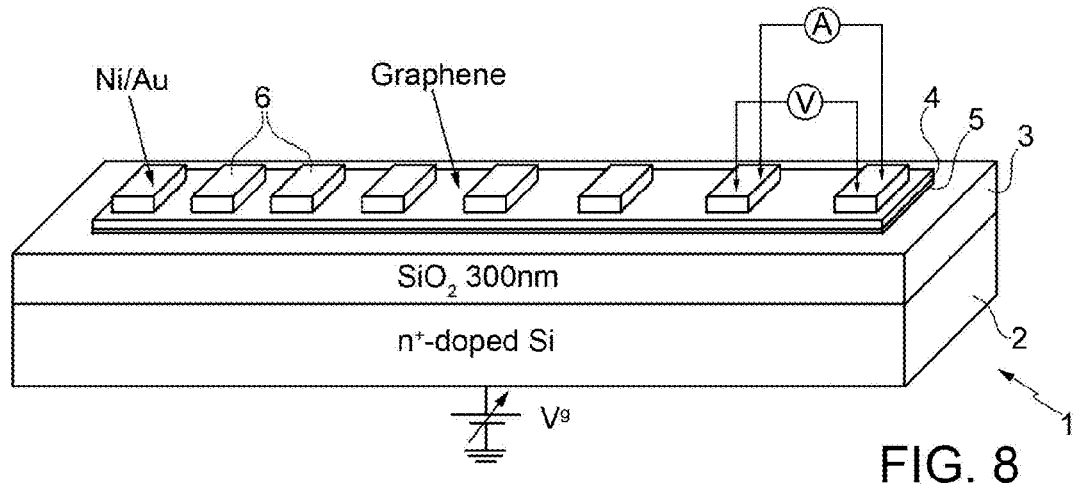
FIG. 8 is a schematic representation of an electronic device built according to one embodiment of the disclosure.

According to a further aspect of the disclosure an electronic device is moreover provided. With reference to FIG. 8 a TLM (transmission line model) structure 1 is illustrated.

TLM structures are used as test structures for characterization of the electrical properties of the graphene transferred onto $SiO_2$ in so far as they make it possible to obtain information both on the resistance of the graphene layer and on the contact resistance of the metal contacts on the graphene itself.

The TLM structure 1 of FIG. 8 comprises a doped-silicon substrate 2 having at least one hydrophilic surface 3 of silicon oxide, a graphene layer 4 extending over the hydrophilic surface of the substrate 2, and a layer of a solvent 5. The solvent is selected in the group constituted by acetone, ethyl lactate, isopropyl alcohol, methylethyl ketone, and mixtures thereof and is set between the hydrophilic surface 3 and the graphene layer 4. The TLM structure 1 is moreover provided with contacts 6 arranged with different spacing between one another.

In one embodiment the device is selected in the group constituted by a transistor, a non-volatile memory, a photodetector, an $NH_3$ and $NO_2$ sensor, and more in general all those devices that presuppose transfer of graphene onto a silicon oxide.

Further characteristics of the present disclosure will emerge from the ensuing description of some examples provided merely by way of non-limiting illustration.

The first example involves the creation of a substrate-graphene interface with the method according to one embodiment of the disclosure.

As described previously, it is possible to create an interface between a substrate and a graphene layer.

The graphene layer is, for example, formed in a way in itself known using a technique of CVD deposition on a copper sheet. The substrate is a silicon-oxide substrate ($SiO_2$), or a silicon substrate (Si) having at least one silicon-oxide surface layer (for example, obtained by thermal growth of $SiO_2$ on the silicon substrate, or by deposition of $SiO_2$, or by some other known technique).

In particular, the silicon-oxide substrate or (layer), treated with a mixture of ethyl lactate and methylethyl ketone (60:40) by dipping, underwent rinsing with $H_2O$ and a subsequent drying step. The graphene layer was transferred onto the silicon-oxide substrate (or layer) pre-treated using the technique described and in itself known, which is used for many applications in the microelectronics industry.

A comparative experimental test was then conducted by comparing a sample of silicon oxide pre-treated according to the standard procedure (SC-1 and oxygen plasma) with a sample obtained according to the method described above, both samples presenting, on a hydrophilic surface thereof, a graphene layer.

Figure 2:
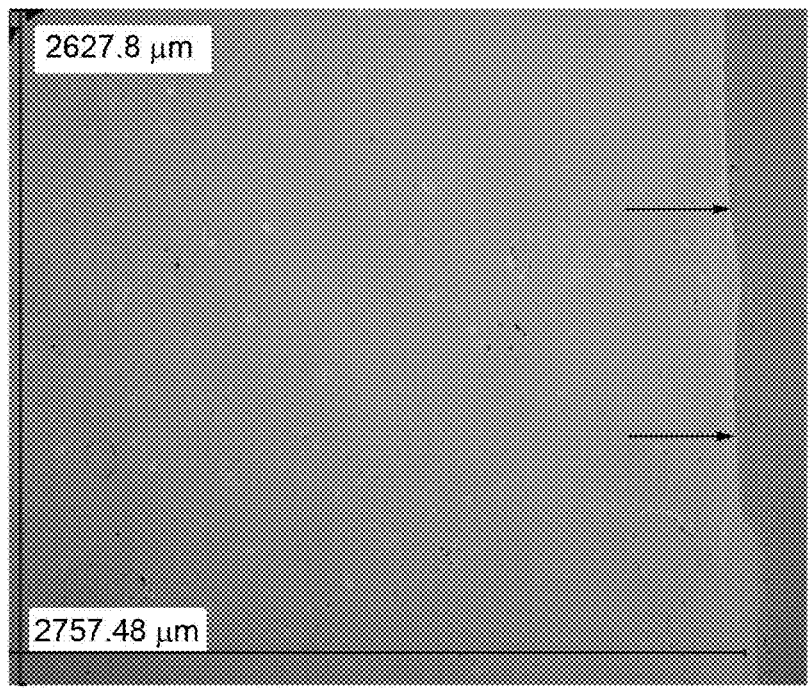
FIG. 2 illustrates a micrograph of a graphene-substrate structure obtained with a method according to one embodiment of the disclosure.

The optical micrographs of the graphene transferred onto the $SiO_2$, both after pre-treatment in SC-1 and oxygen plasma (FIG. 1) and after pre-treatment with the method according to one embodiment of the disclosure (FIG. 2), highlight the presence of graphene correctly transferred in both cases.

Figure 3:
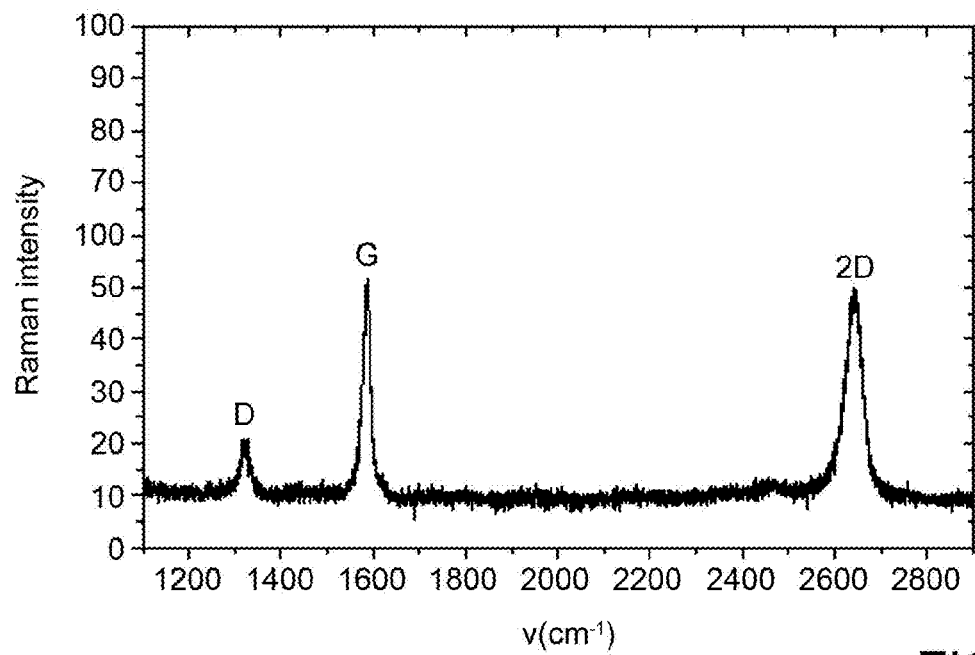
FIG. 3 illustrates the Raman spectrum of a silicon-oxide substrate pre-treated with a method according to one embodiment of the disclosure and coupled to a graphene layer.
Figure 4:
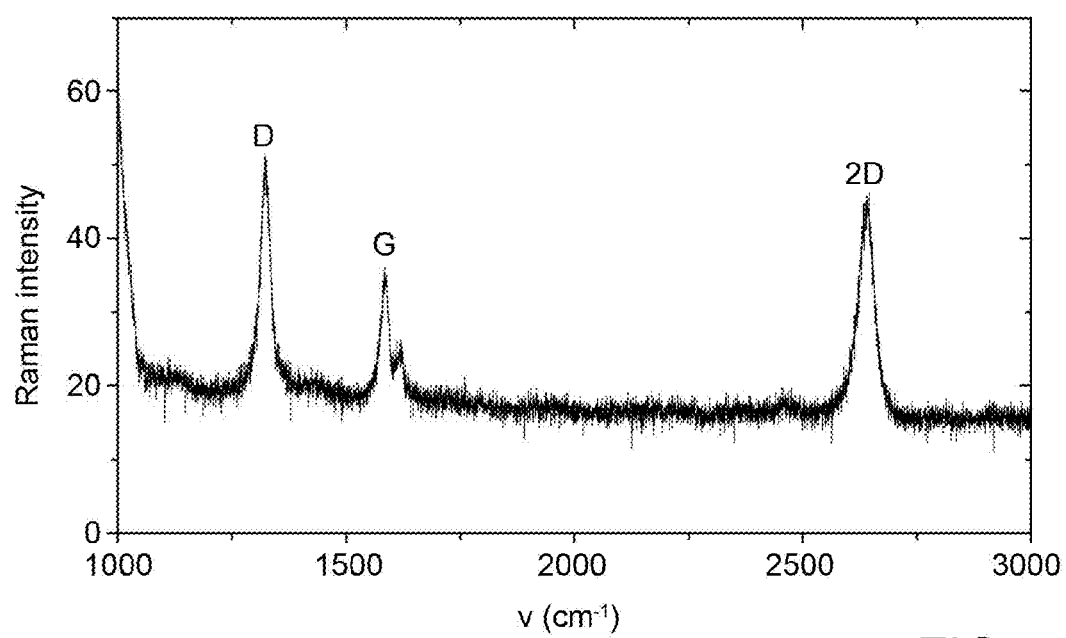
FIG. 4 illustrates the Raman spectrum of a silicon-oxide substrate pre-treated in SC-1 and oxygen plasma and coupled to a graphene layer.
Figure 5:
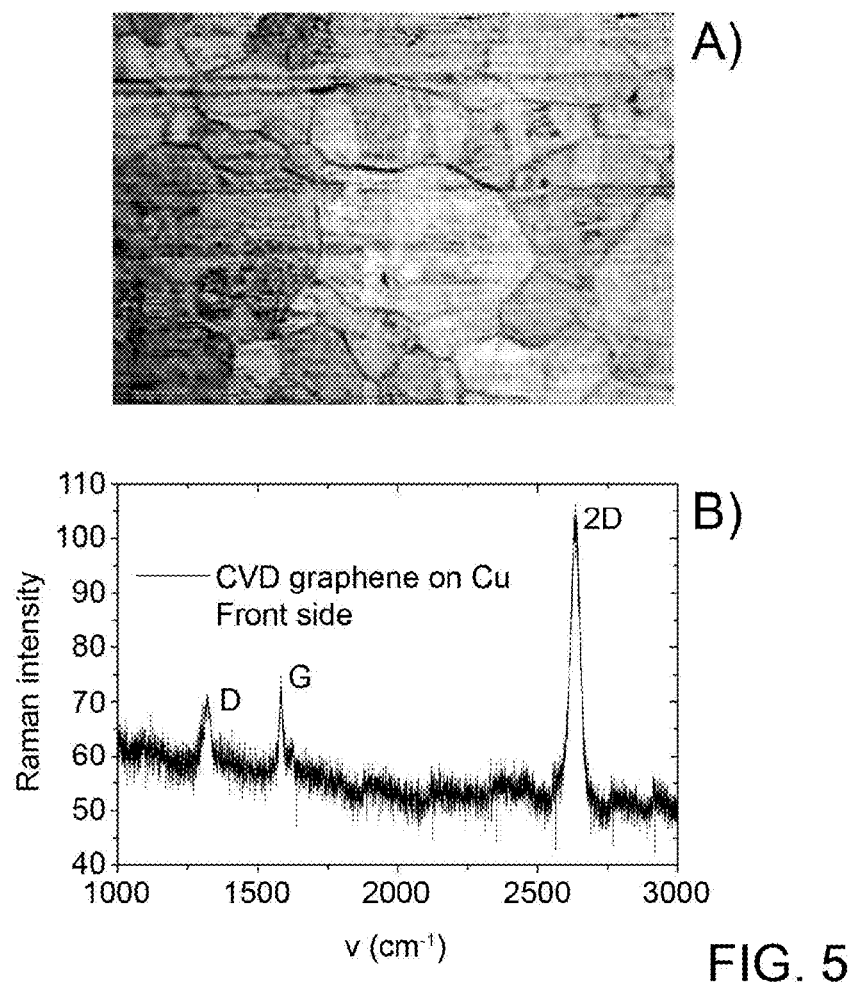
FIG. 5 illustrates a) a micrograph of a graphene layer grown by CVD, and b) the Raman spectrum of the graphene grown by CVD.

This is confirmed by the Raman spectra for the two samples shown in FIGS. 3 and 4, which present the characteristic G and 2D peaks typical of graphene; the evidence of a further peak (D) representing defects cannot, however, be attributed to the transfer procedure nor to the pre-treatment of the $SiO_2$, but is inherent in the material (graphene) originally grown on the copper substrate, as may be appreciated from FIG. 5b, which shows the Raman spectrum of the graphene grown by CVD.

Figure 6:
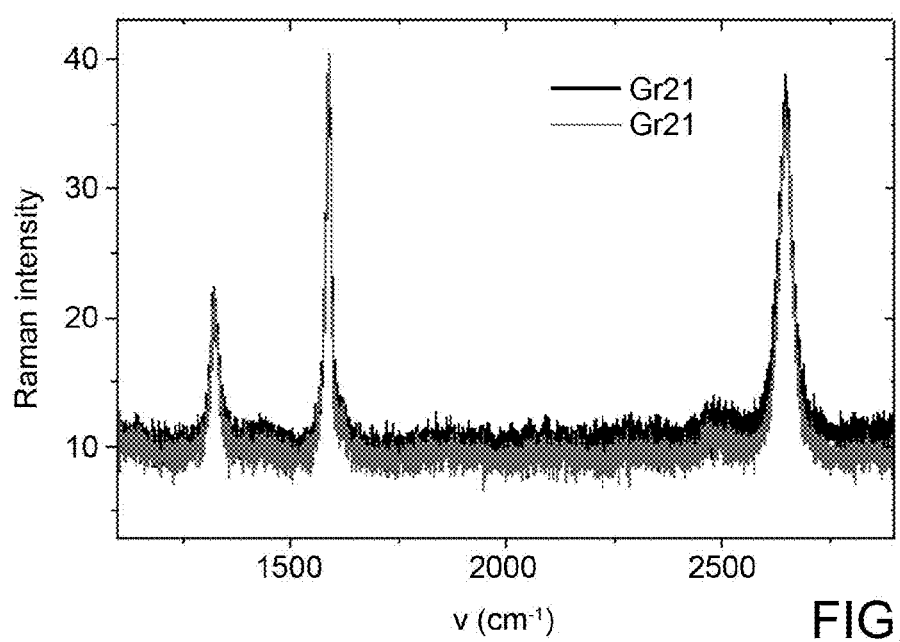
FIG. 6 illustrates two Raman spectra of the graphene transferred onto a silicon-oxide substrate immediately after the treatment according to the disclosure (GR21) and after four weeks (GR22)

From a comparison of the Raman spectra of the graphene transferred onto the surface pre-treated with the method according to the disclosure obtained in two different moments, namely, immediately after the pre-treatment and after four weeks, it may be noted that these substantially coincide (see FIG. 6, GR21 indicates the spectrum of the graphene transferred onto a silicon-oxide substrate immediately after treatment with the method according to the disclosure, GR22 indicates the spectrum of the graphene transferred onto a silicon-oxide substrate four weeks after treatment with the method according to the disclosure).

Similar results were obtained from the analysis for devices in which the substrate-graphene coupling was obtained with any of the other solvents according to the disclosure.

The original surface, i.e., the surface without the solvent layer, made of silicon oxide, may be restored, if desired, through an oxygen-plasma treatment, in order to remove the solvent layer.

Measurements of sheet resistance ($R_{sh}$) were made with the four-point probe method on two different samples having respective layers of silicon oxide with chemico-physical characteristics similar to one another and pre-treated, respectively, (i) according to the standard procedure (SC-1 and oxygen plasma), and (ii) according to the method described above. The four-point probe method for measurement of the sheet resistance is known in the literature (Schroder, D. K. *Semiconductor Material and Device Characterization,* 3rd ed.; John Wiley & Sons: Hoboken, N.J., 2006).

The above measuring method made it possible to carry out a comparison between the electrical properties of the two samples without any further lithographic process for making contacts, thus preventing introduction of any additional contamination on the graphene surface that might have interfered with the results.

Figure 7:
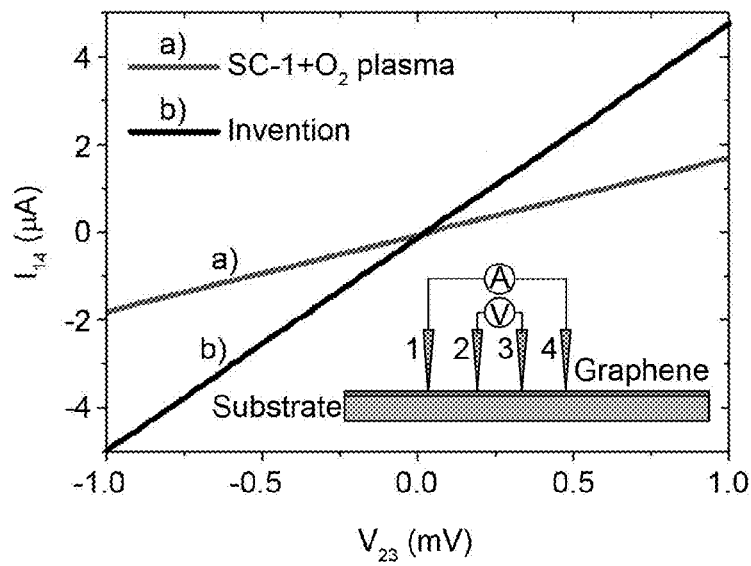
FIG. 7 illustrates I-V characteristics measured on CVD graphene transferred onto $SiO_2$ treated by means of the SC-1+ oxygen plasma procedure and using the method according to the disclosure.

The current-voltage characteristics (I-V) measured on the two samples are shown in FIG. 7.

The values of sheet resistance ($R_{sh}$) obtained from the four-point probe measurements appear in Table 1 below.

TABLE 1

| Pre-treatment of the $SiO_2$ surface | $R_{sh}$ (k$\Omega$/sq) |
|---|---|
| SC-1 and oxygen plasma | 2.6 ± 0.2 |
| One embodiment according to the disclosure | 0.9 ± 0.1 |

From the results obtained it is clear that the pre-treatment of the $SiO_2$ surface, in addition to being less aggressive as compared to the standard procedure, affords an improvement of the electrical properties of the transferred graphene, with a reduction of the sheet resistance approximately by a factor of three. This effect may be attributed both to an improvement of the structural quality of the graphene, due to a reduction of the macroscopic defects (for example, cracks or corrugations) due to a better adhesion to the substrate, and to a reduction of the phenomena of electronic scattering at the interface with the $SiO_2$.

Similar results have been obtained from analysis for devices where the substrate-graphene coupling was obtained with any of the other solvents according to the disclosure.

The procedure of pre-treatment of the oxide carried out according to the disclosure was successfully implemented for producing of elementary devices, such as, for example, TLM structures, which made it possible to investigate the electronic properties of the graphene, such as for example the type of carriers and their density, and the mobility and the specific contact resistance of metal contacts on the graphene.

FIG. 8 is a schematic representation of a linear TLM structure 1 obtained with the graphene 4 transferred onto the $SiO_2$. In this example, the $SiO_2$ layer 3 extends over a doped-silicon substrate 2, which can hence be used as gate electrode, also referred to, in this example, as "backgate".

Each TLM structure 1 is represented by a graphene strip 4 of a rectangular shape, for example having dimensions $(1100 \times 240) \mu m^2$, electrically insulated laterally by means of an oxygen-plasma etch, and provided with a series of contacts 6 made of nickel/gold (Ni/Au) arranged at different distances apart. Coupling between the $SiO_2$ and the graphene is obtained by creation of a layer 5 of a mixture of ethyl lactate and methylethyl ketone (60:40).

Figure 9:
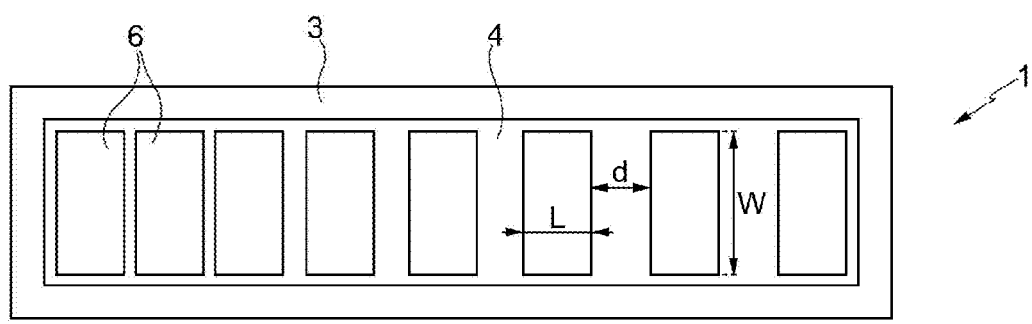
FIG. 9 shows the top plan view of the TLM (transmission line model) structure illustrated in FIG. 8.

FIG. 9 shows a top-plan view, indicated in which are the width W and the length L of the metal contacts and their mutual spacing d (of variable value) of the TLM structure illustrated in FIG. 8.

Figure 10:
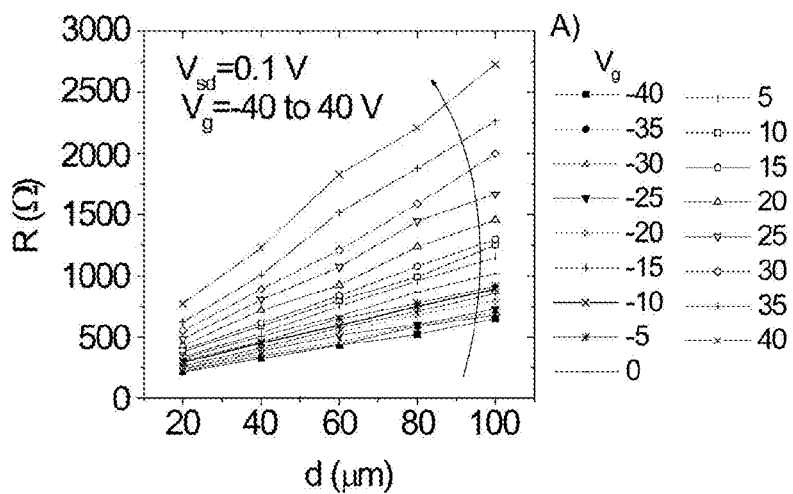
FIG. 10 illustrates (a) the resistance measured between pairs of adjacent contacts in a TLM structure as a function of the distance between the contacts for backgate voltages ranging from −40 to 40 V, (b) the plot of the sheet resistance as a function of $V_g$ and (c) the conductance $G=1/R_{sh}$ as a function of $V_g$.
Figure 10:
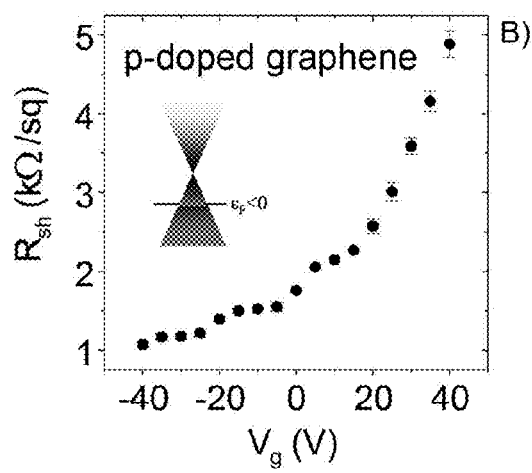
Figure 10:
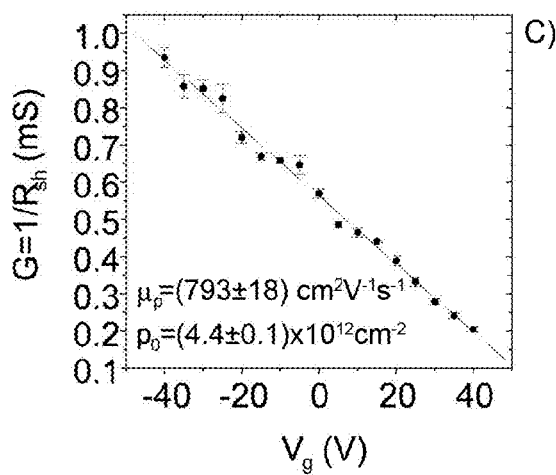

FIG. 10(a) shows the values of the resistance R measured between pairs of adjacent contacts as a function of the spacing d between said contacts for gate voltages $V_g$ ranging from −40 to 40 V. From the linear approximation of each of these curves there are obtained the values of the sheet resistance $R_{sh}$ of the graphene for the different values of $V_g$, the plot of which is shown in FIG. 10(b).

It should be noted that $R_{sh}$ increases monotonically as a function of $V_g$ over the entire range of voltages considered. As the value of $V_g$ varies a shift of the Fermi level is induced in the graphene and, as a consequence of this, a variation is obtained of the concentration of charge carriers and, hence, of the sheet resistance.

From an observation of the plot it emerges that, in this voltage range, the concentration of charge carriers in the graphene decreases as the applied voltage increases. This indicates that the charge carriers are holes, i.e., that the graphene has a doping of a p type.

FIG. 10(c) shows the conductance $G=1/R_{sh}$, which demonstrates a clear linear dependence upon the gate voltage $V_g$. This typical plot indicates that the mechanisms that limit the transport of current in the graphene transferred onto $SiO_2$ are scattering of the electrons with electrically charged impurities and/or with resonant scattering centers (polymeric defects or impurities). From the linear approximation of the data in FIG. 10(c), there is obtained the mobility $\mu_p$ of the holes of the graphene, which is approximately $\mu_p=(793\pm18)$ $cm^2V^{-1}s^{-1}$, and the concentration $p_0$ of the holes of the graphene with a gate voltage $V_g=0$, which is approximately $p_0=(4.4\pm0.1)\cdot10^{12}$ $cm^{-2}$.

In order to assess the variations in the values of sheet resistance and of the specific contact resistance in different positions on the graphene layer transferred onto $SiO_2$, a plurality of TLM structures were obtained, with different orientations (vertical and horizontal).

Figure 11:
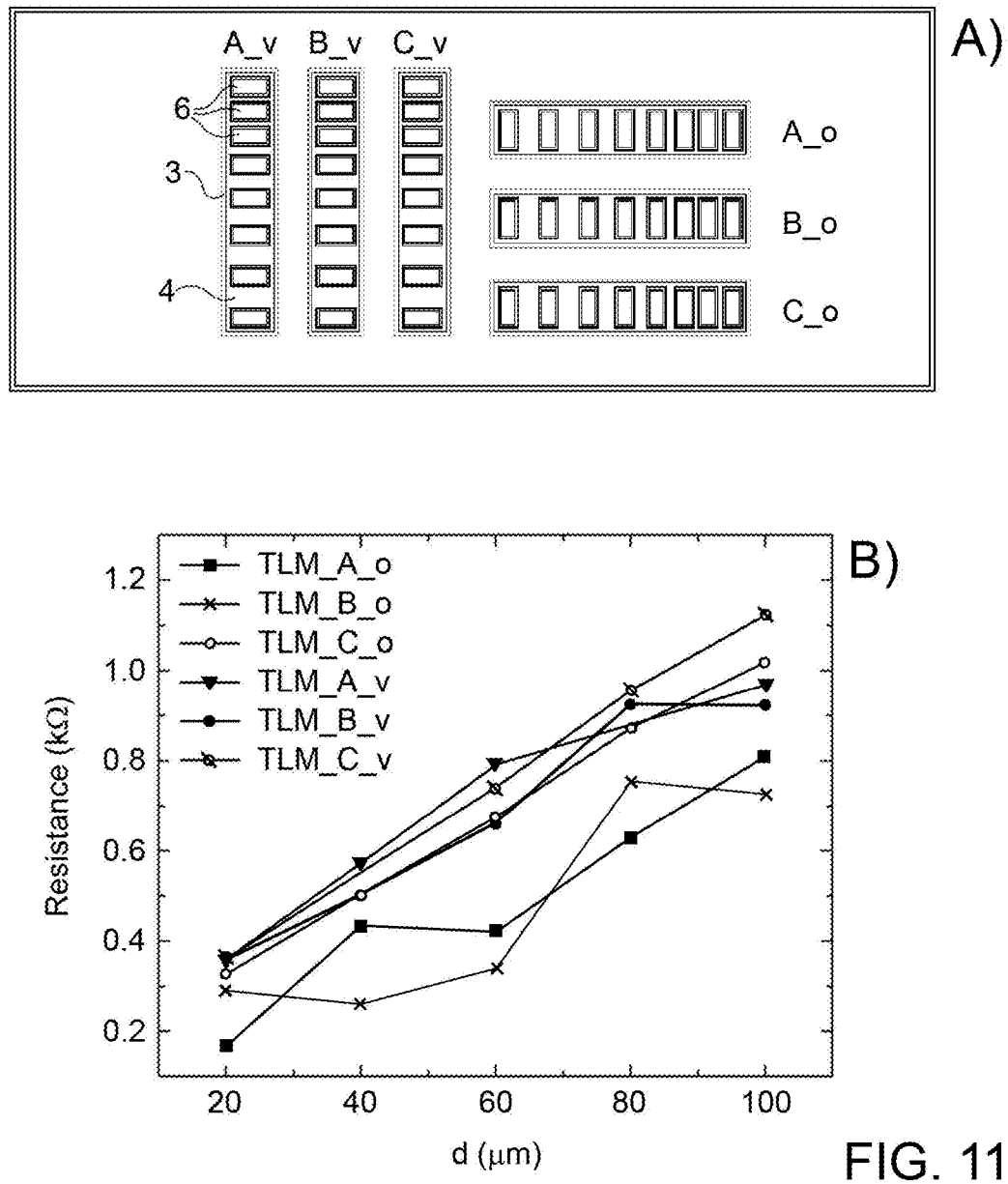
FIG. 11 illustrates (a) the diagram of a chip comprising six identical TLM structures (three oriented vertically (A_v, B_v, C_v) and three oriented horizontally (A_o, B_o, C_o)) provided on an area of the sample of (2.6×1.3) mm², and (b) the plots of the resistance R as a function of the distance d measured on the six TLM structures of the chip.

FIG. 11(a) shows the scheme of a chip constituted by six identical TLM structures provided on an area of the sample of $(2.6 \times 1.3)$ $mm^2$. The plot of the resistance R as a function of the spacing d between the contacts of each TLM structure, measured on the TLM structures of FIG. 11(a), is illustrated in FIG. 11(b). Table 2 appearing below gives the values of the sheet resistance and of the specific contact resistance obtained on the six TLM structures of FIG. 11(a). The comparison between the values obtained provides information on the lateral uniformity over a wide area of the transferred graphene.

TABLE 2

| TLM | $R_{sheet}$ (kΩ/sq) | ρc ($10^{-4}$ Ωcm²) |
|---|---|---|
| A_o | 1.48 ± 0.21 | 2 ± 3 |
| B_o | 1.36 ± 0.42 | 3 ± 9 |
| C_o | 1.75 ± 0.10 | 13 ± 1 |
| A_v | 1.50 ± 0.25 | 45 ± 20 |
| B_v | 1.54 ± 0.21 | 30 ± 14 |
| C_v | 1.93 ± 0.10 | 14 ± 2 |

As emerges from Table 2, the resistance of the graphene layer may vary from ~1.9 to ~1.5 kΩ/sq (approximately 20%) passing from one TLM structure to another, whereas the specific contact resistance may vary very significantly from point to point, ranging from ~2×10⁻⁴ to ~45×10⁻⁴ Ωcm².

Similar results were obtained from analysis for devices where the substrate-graphene coupling was obtained by means of any of the other solvents according to the disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic device comprising:
   a substrate having at least one hydrophilic surface that includes hydroxyl and silanolic groups,
   a graphene layer, and
   elements or functional groups from a solvent selected from the group consisting of acetone, ethyl lactate, isopropyl alcohol, methylethyl ketone, and mixtures thereof, located between said substrate and said graphene layer and integrated with the hydrophilic surface to obtain a contact angle of the hydrophilic surface of about 40 degrees.

2. The device according to claim 1, wherein the device is one of a transistor, a non-volatile memory, a photodetector, an $NH_3$ and $NO_2$ sensor.

3. The device according to claim 1, wherein the substrate includes silicon oxide.

4. The device according to claim 1, wherein the substrate is made of silicon oxide or passivized silicon.

5. The device according to claim 1, wherein the elements or functional groups include alkyl groups.

6. The device according to claim 5, wherein the device is one of a transistor, a non-volatile memory, a photodetector, an $NH_3$ and $NO_2$ sensor.

7. The device according to claim 5, wherein the substrate includes silicon oxide.

8. The device according to claim 1, wherein the elements or functional groups include ketone compounds.

9. The device according to claim 8, wherein the device is one of a transistor, a non-volatile memory, a photodetector, an $NH_3$ and $NO_2$ sensor.

10. The device according to claim 8, wherein the substrate includes silicon oxide.

11. The device according to claim 1, wherein the elements or functional groups include carbonyl groups.

12. The device according to claim 11, wherein the device is one of a transistor, a non-volatile memory, a photodetector, an $NH_3$ and $NO_2$ sensor.

13. The device according to claim 11, wherein the substrate includes silicon oxide.

14. The device according to claim 1, wherein the elements or functional groups are from a mixture of methylethyl ketone and ethyl lactate.

15. The device according to claim 14, wherein the device is one of a transistor, a non-volatile memory, a photodetector, an $NH_3$ and $NO_2$ sensor.

16. The device according to claim 14, wherein the substrate includes silicon oxide.

17. The device according to claim 1, wherein a sheet resistance of the graphene layer is about 0.9 kilo-ohms per square.

18. An electronic device comprising:
a substrate having at least one hydrophilic surface,
a graphene layer, and
elements or functional groups from a solvent selected from the group consisting of acetone, ethyl lactate, isopropyl alcohol, methylethyl ketone, and mixtures thereof, located between said substrate and said graphene layer and integrated with the hydrophilic surface to obtain a contact angle of the hydrophilic surface of about 40 degrees, the elements or functional groups including alkyl groups.

19. The device according to claim 18, wherein the device is one of a transistor, a non-volatile memory, a photodetector, an $NH_3$ and $NO_2$ sensor.

20. The device according to claim 18, wherein the substrate includes silicon oxide.

21. An electronic device comprising:
a substrate having at least one hydrophilic surface,
a graphene layer, and
elements or functional groups from a solvent selected from the group consisting of acetone, ethyl lactate, isopropyl alcohol, methylethyl ketone, and mixtures thereof, located between said substrate and said graphene layer and integrated with the hydrophilic surface to obtain a contact angle of the hydrophilic surface of about 40 degrees, the elements or functional groups include ketone compounds.

22. The device according to claim 21, wherein the device is one of a transistor, a non-volatile memory, a photodetector, an NH3 and NO2 sensor.

23. The device according to claim 21, wherein the substrate includes silicon oxide.

24. An electronic device comprising:
a substrate having at least one hydrophilic surface,
a graphene layer, and
elements or functional groups from a solvent selected from the group consisting of acetone, ethyl lactate, isopropyl alcohol, methylethyl ketone, and mixtures thereof, located between said substrate and said graphene layer and integrated with the hydrophilic surface to obtain a contact angle of the hydrophilic surface of about 40 degrees, the elements or functional groups include carbonyl groups.

25. The device according to claim 24, wherein the device is one of a transistor, a non-volatile memory, a photodetector, an NH3 and NO2 sensor.

26. The device according to claim 24, wherein the substrate includes silicon oxide.

27. An electronic device comprising:
a substrate having at least one hydrophilic surface,
a graphene layer, and
elements or functional groups from a mixture of methylethyl ketone and ethyl lactate, located between said substrate and said graphene layer and integrated with the hydrophilic surface to obtain a contact angle of the hydrophilic surface of about 40 degrees.

28. The device according to claim 27, wherein the device is one of a transistor, a non-volatile memory, a photodetector, an NH3 and NO2 sensor.

29. The device according to claim 27, wherein the substrate includes silicon oxide.

30. An electronic device comprising:
a substrate having at least one hydrophilic surface,
a graphene layer having a sheet resistance of about 0.9 kilo-ohms per square, and
elements or functional groups from a solvent selected from the group consisting of acetone, ethyl lactate, isopropyl alcohol, methylethyl ketone, and mixtures thereof, located between said substrate and said graphene layer and integrated with the hydrophilic surface to obtain a contact angle of the hydrophilic surface of about 40 degrees.

31. The device according to claim 30, wherein the device is one of a transistor, a non-volatile memory, a photodetector, an NH3 and NO2 sensor.

32. The device according to claim 30, wherein the substrate includes silicon oxide.

* * * * *